(12) United States Patent
Dodd et al.

(10) Patent No.: US 7,543,917 B2
(45) Date of Patent: Jun. 9, 2009

(54) INTEGRATED CIRCUIT AND METHOD FOR MANUFACTURING

(75) Inventors: Simon Dodd, Philomath, OR (US); S. Jonathan Wang, Albany, OR (US); Dennis W. Tom, Corvallis, OR (US); Frank R. Bryant, Denton, TX (US); Terry E. McMahon, Albany, OR (US); Richard Todd Miller, Corvallis, OR (US); Gregory T. Hindman, Albany, OR (US)

(73) Assignee: Hewlett-Packard Development Comapny, L.P., Houston, TX (US)

( * ) Notice: Subject to any disclaimer, the term of this patent is extended or adjusted under 35 U.S.C. 154(b) by 238 days.

(21) Appl. No.: 11/540,321

(22) Filed: Sep. 29, 2006

(65) Prior Publication Data

US 2007/0026548 A1 Feb. 1, 2007

Related U.S. Application Data

(62) Division of application No. 10/977,091, filed on Oct. 29, 2004, now Pat. No. 7,150,516.

(60) Provisional application No. 60/613,871, filed on Sep. 28, 2004.

(51) Int. Cl.
*B41J 2/05* (2006.01)

(52) U.S. Cl. ........................................................ 347/59
(58) Field of Classification Search ............. 347/57–59, 347/63, 203–206; 438/21
See application file for complete search history.

(56) References Cited

U.S. PATENT DOCUMENTS

| 5,122,812 | A | * | 6/1992 | Hess et al. ..................... 347/59 |
| 5,635,968 | A | | 6/1997 | Bhaskar et al. |
| 5,870,121 | A | | 2/1999 | Chan |
| 6,286,939 | B1 | | 9/2001 | Hindman et al. |
| 6,740,536 | B2 | | 5/2004 | Dodd et al. |
| 2004/0124449 | A1 | | 7/2004 | Liu et al. |

* cited by examiner

*Primary Examiner*—An H Do

(57) ABSTRACT

A method of forming a semiconductor device, the method including forming a substrate including a first surface having a non-doped region, forming an insulative material over the first surface of the substrate, forming a first conductive material over the first insulative material, forming an opening in the first conductive material that forms a path to the substrate that is substantially free of the first conductive material and the first insulative material, forming a second insulative material over the first conductive material, and forming a second conductive material over the second insulative material, wherein the second conductive material is formed in the opening and contacts the non-doped region of the substrate.

28 Claims, 8 Drawing Sheets

INTEGRATED CIRCUIT AND METHOD FOR MANUFACTURING

CROSS-REFERENCE TO RELATED APPLICATIONS

This application is a divisional of U.S. utility application entitled, "Integrated Circuit and Method for Manufacturing," having Ser. No. 10/977,091, filed Oct. 29, 2004 now U.S. Pat. No. 7,150,516, which application claims the benefit of U.S. Provisional Application No. 60/613,871, filed on Sep. 28, 2004, both of which are entirely incorporated herein by reference.

BACKGROUND

The market for electronic devices continually demands increased performance at decreased costs. In order to meet these requirements the components which comprise various electronic devices are desired to be made more efficiently and to more demanding design specifications.

One type of electronic device is a metal oxide silicon transistor device. These oxide silicon transistor devices are formed in large numbers on a single substrate, such as a silicon substrate. A problem in operating such devices at high voltages is that continuous operation may cause formation of a number of electron-hole pairs at junctions of the transistor, e.g. drain-gate junction. The electron-hole pairs, if they form sufficiently large charge concentrations, may decrease threshold voltage of the transistors or may lead to a turning of parasitic lateral bipolar transistor formed in the substrate.

Two countervailing factors in the design and manufacture of electronic devices are improved performance and decreased cost. Often these two factors are in direct opposition, since the formation of more precise geometries and additional structures require additional processing and masks that add to the cost of devices. On the other hand, reducing processing and masks may lead to performance problems or the inability to provide operation within performance specifications, since structures may have to be omitted from the electronic device.

BRIEF DESCRIPTION OF THE DRAWINGS

Features of the invention will readily be appreciated by persons skilled in the art from the following detailed description of exemplary embodiments thereof, as illustrated in the accompanying drawings, in which.

DETAILED DESCRIPTION OF THE DRAWINGS

Figure 1:
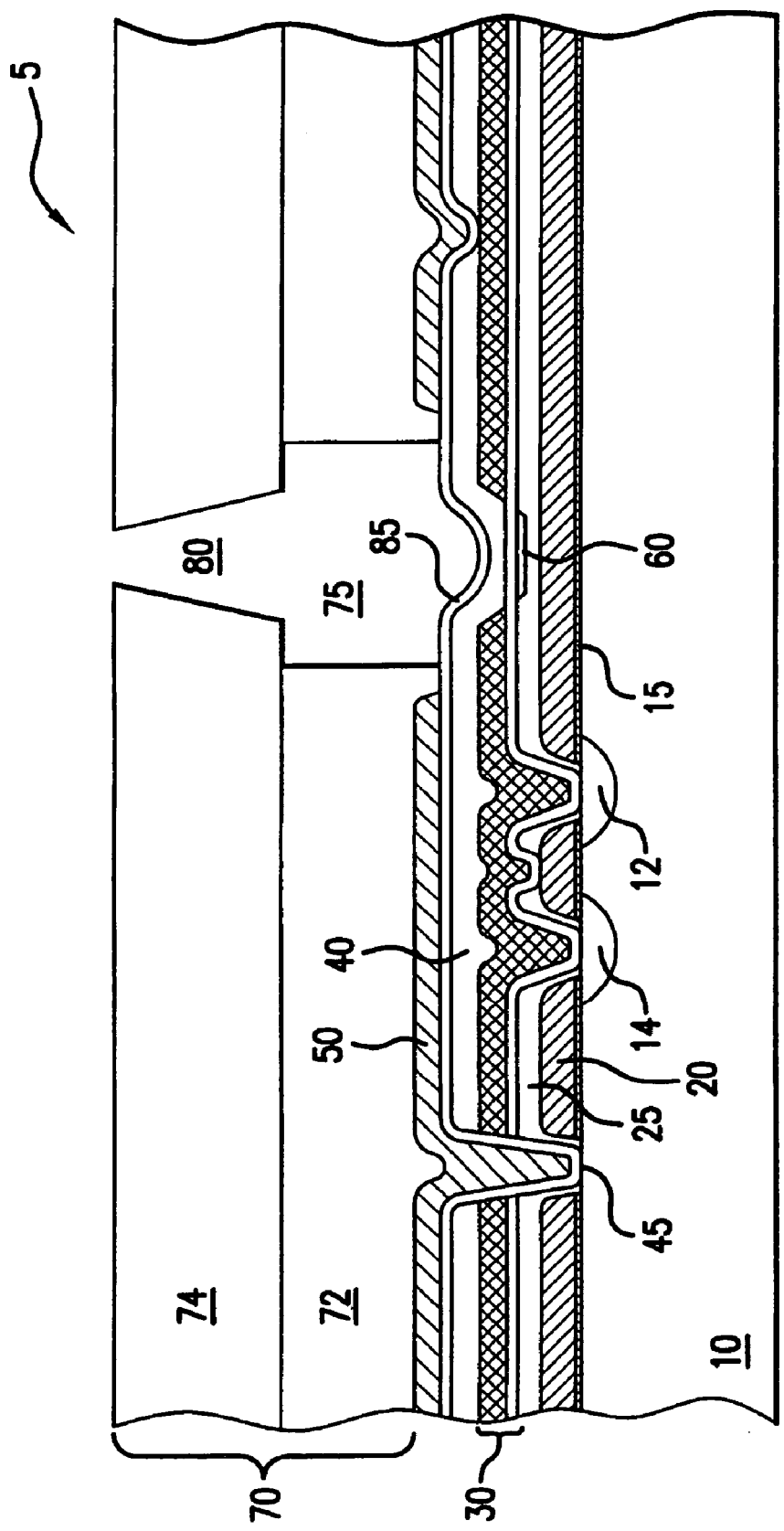
FIG. 1 illustrates a cross-sectional view of a fluid ejection device according to one embodiment.

Referring to FIG. 1, a cross-sectional view of a fluid ejection device according to one embodiment is illustrated. A semiconductor device 5 is formed on and/or in substrate 10, which is preferably silicon though other substrates known to those skilled in the art may be used. Substrate 10 is processed using conventional semiconductor processing techniques to form one or more areas 12 and 14 having different impurity concentrations, e.g. active regions that form a transistor or diode. In this embodiment, where semiconductor device 5 includes Metal Oxide Semiconductor Field Effect Transistors (MOSFETs) active areas may include drain and source regions formed in substrate 10.

A gate oxide layer 15 is disposed over a surface of the substrate 10. A semiconductor layer 20, e.g. formed of polysilicon, is disposed over the gate oxide layer 15. In some areas, a passivation layer 25, e.g. phosphosilicate glass, is disposed over semiconductor layer 20. In other areas, a conductive layer 30 disposed over semiconductor layer 20. However, other structures with only a conductive layer may be utilized.

In the embodiment depicted in FIG. 1, conductive layer 30 comprises a resistive material, e.g. a tantalum-aluminum material, which has a conductive material, e.g. aluminum, disposed thereon. It should also be noted that conductive layer 30 is disposed over passivation layer 25 as well. Further, the materials used to form resistive material and/or conductive material may vary and depend upon the application and specifications.

A passivation layer 40 is disposed over conductive layer 30 in order to insulate and protect conductive layer 30. The passivation layer 40 may be formed of one or more silicon carbide and silicon nitride, or multiple layers of each of these or combinations thereof. Further, other materials or combinations thereof may be utilized for passivation layer 40.

A plurality of openings 45 are formed in gate oxide layer 15, semiconductor layer 20, passivation layer 25, conductive layer 30, and passivation layer 40 to allow conductive layer 50, which is also disposed over passivation layer 40 to contact the surface, or if the surface is partially removed, other portions of substrate 10. In one embodiment, conductive layer 50 contacts body regions of a transistor device that are formed in substrate 10. In these embodiments, the body region may be a p-doped region, however, other dopings may be utilized.

In one embodiment, the openings 45 and the resulting contacts formed therein are formed as close to active regions or devices formed in the substrate as possible, without affecting the operation of the devices or active regions. The exact positioning, may be dependent on the substrate type and doping concentration of the active regions. In addition, the number of contacts is dependent on the number of active regions or devices formed in the substrate. In one embodiment, there may be one contact for every device formed in the substrate. In certain embodiments, the number of contacts may be a function of the power of the devices formed in the substrate, the doping concentration of active regions, and the substrate material.

The creation of a direct contact to the body of a MOSFET can be used to prevent an increase of hole pairs at a drain/gate interface, which in turn can reduce the likelihood that the MOSFET is switched on due to small leakage currents provided at its gate.

In certain embodiments, direct contact may be made between one or more transistors formed in substrate 10. In these embodiments, contact may be made adjacent a source region of one or more of the transistors. In these embodiments contacts to the source region and the body may be made at the same or different times. In an embodiment where semiconductor device 5 is a fluid ejection device, the direct contact may be between a logic transistor and a drive transistor that operate ejection elements.

The resistor 60 and the passivation layer 40 are protected from damage, due to for example bubble collapse, in fluid chamber 75 after fluid ejection from orifice 80 by a cavitation layer 85 that is disposed over passivation layer 40. In certain embodiments, cavitation layer 85 comprises a metal selected from the group consisting of tantalum, tungsten, and molybdenum.

An orifice layer 70, shown as a barrier layer 72 and a nozzle layer 74 are provided to create a chamber 75 and orifice 80 through which fluid may be ejected. Generally, the other layers that are disposed on substrate 10 before applying the orifice layer 70. The orifice layer 70 can be a single or multiple layer(s) of polymers, epoxy materials, metals, or the like. Several methods, materials, and structures for creating the orifice layer 70 are known and may be utilized with the structure of FIG. 1.

Figure 2:
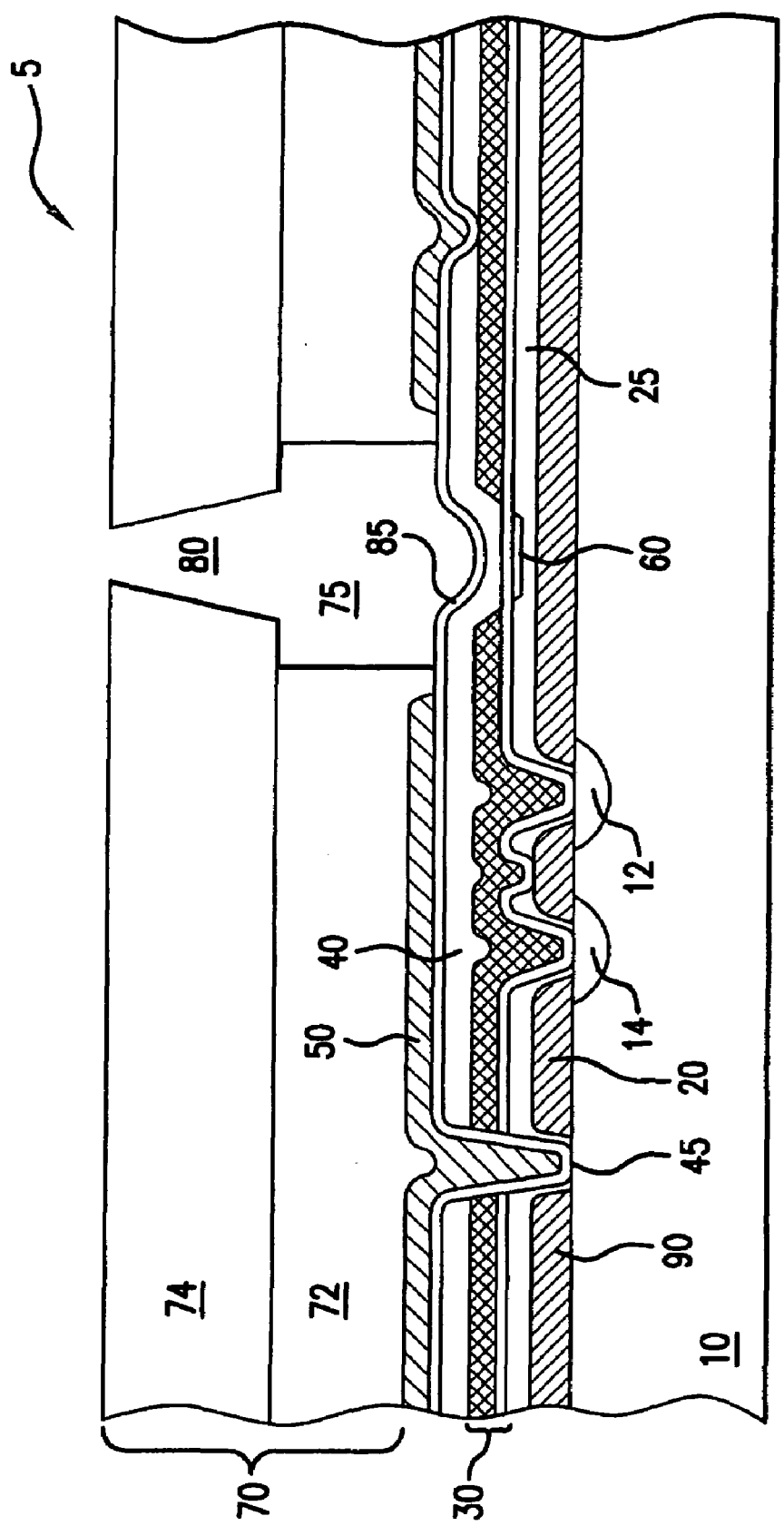
FIG. 2 illustrates a cross-sectional view of a fluid ejection device according to another embodiment.

Referring to FIG. 2, a cross-sectional view of a fluid ejection device according to another embodiment is illustrated. The fluid ejection device of FIG. 2 is substantially similar to FIG. 1. However, a field oxide 90 is disposed on some portions of the surface of substrate 10. The field oxide 90 is provided adjacent to contact regions 95 through which conductive layer 50 is to contact substrate 10. Field oxide 90 generally provides a greater barrier to diffusion than does gate oxide 15.

While FIGS. 1 and 2 provide descriptions of embodiments of fluid ejection devices, however, other semiconductors devices and structures may be utilized having similar layouts and designs. For example, such structures would have orifice layer 70 and cavitation layer 85, and a passivation structure that is different in structure and/or material from passivation layer 40.

Figure 3:
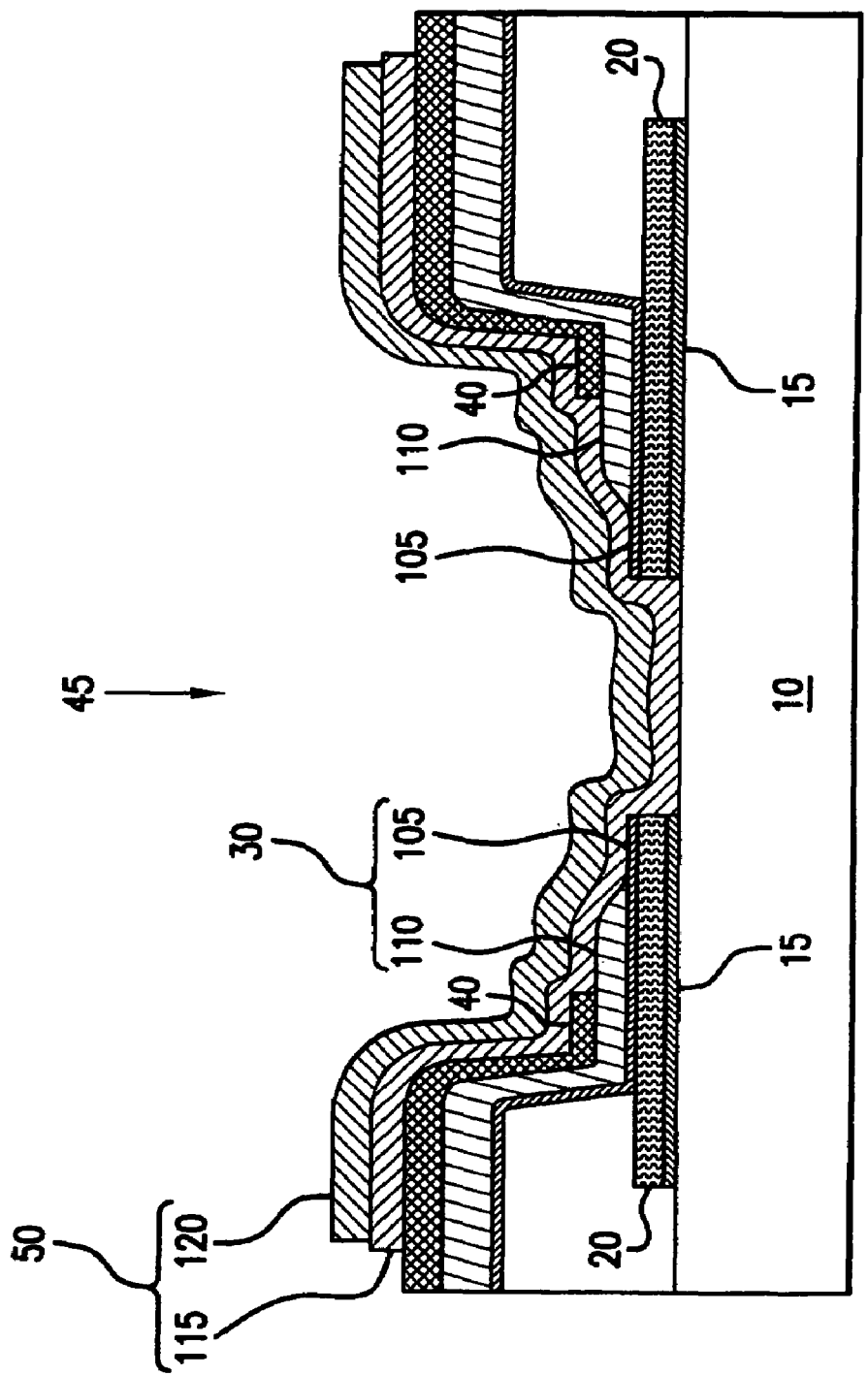
FIG. 3 illustrates an exploded cross-sectional view of a portion of the fluid ejection device of FIG. 1 according to one embodiment.

Referring to FIG. 3, an exploded cross-sectional view of a portion of the fluid ejection device of FIG. 1 according to one embodiment is illustrated. Opening 45 extend from a top surface of passivation layer 40 to a surface of substrate 10. Conductive layer 50, which comprises a resistive layer 115 and a conductive layer 120 disposed over resistive layer 115 is contact with the surface of substrate 10. It can be seen that some portions of conductive layer 50 that overlie passivation layer 25, conductive layer 30, and passivation layer 40 are in electrical contact with those portions of conductive layer 50 that are in physical contact with a surface of substrate 10. As such a robust substrate contact may be created that provides benefits with respect to parasitic turn of devices formed in substrate 10.

An additional design feature of the embodiment depicted in FIG. 3 is that resistive layer 105, conductive layer 110, and passivation layer 40 form a stair-step pattern when viewed from a cross-sectional perspective. This allows for simpler manufacturer. Other embodiments, may utilize different layouts.

Figure 4:
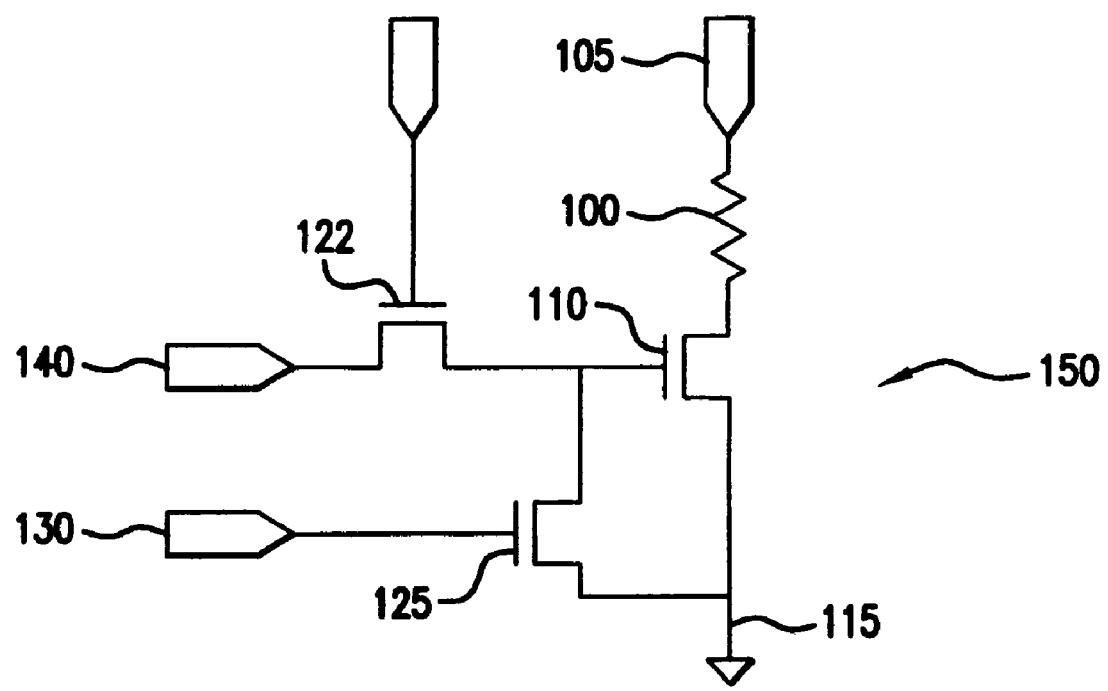
FIG. 4 illustrates a schematic of a circuit used to selectively control fluid ejection according to one embodiment.

Referring to FIG. 4, a schematic of a circuit 150 used to selectively control fluid ejection according to one embodiment is illustrated. The ejection element 100 is coupled to receive power 105 and to the drain of transistor 110. The source of transistor 110 is connected to ground 115. The gate of transistor 110 is connected to the source of transistor 122 and the drain of transistor 125. The source of transistor 125 is connected to ground 115. The gate of transistor 125 is coupled to receive a first control signal 130. The gate of transistor 122 is coupled to receive a second control signal 135, while its gate is coupled to receive an address signal 140.

In certain embodiments, contacts to body regions may be formed between a source region of transistor 110 and the source region of any of transistors 122 or 125. In some embodiments, where each ejection element is operated using the circuit 150 depicted in FIG. 4, a body contact can be made in each circuit 150 or some of the circuits 150.

Figure 5:
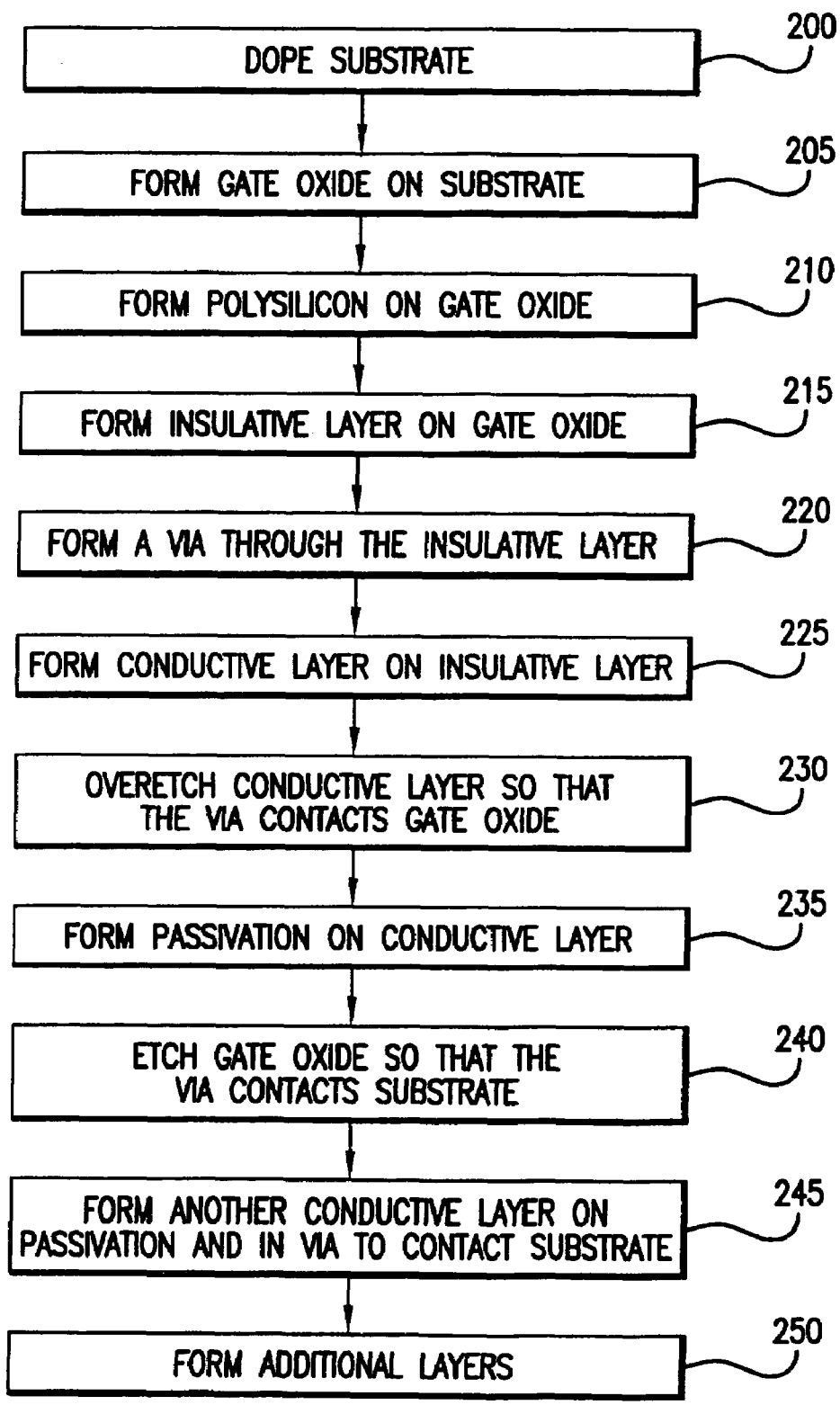
FIG. 5 illustrates a flow chart of a process for forming a fluid ejection device according to one embodiment.

Referring to FIG. 5, a flow chart of a process for forming a fluid ejection device according to one embodiment is illustrated. A substrate, e.g. substrate 10, may be doped with a p-dopant for an NMOS process, block 100. However, the substrate may also be doped with an n-dopant for a PMOS process. A gate oxide material is then provided over a surface of the substrate, block 205. After the gate oxide material is provided, a semiconductor material, such as polysilicon, is provided over the gate oxide material, block 210. An insulative material, such as phosphosilicate glass, is provided over semiconductor material, block 215.

After providing the insulative material, one or more vias are formed in the insulative material, block 220. For example, the one or more vias may be formed in areas where a contact to a body of a transistor may be desired to be formed. The vias may be etched to a surface of the semiconductor material provided in block 215. After formation of the one or more vias, a first conductive layer is provided over the insulative material and into the one or more vias, block 220. The one or more vias are then overetched such that not only the conductive material in the one or more vias, but also the semiconductor material that underlie the one or more vias are removed, block 230. In this embodiment, the gate oxide formed still remains in the vias. In one embodiment, the overetching process is a reactive ion etching process.

After the conductive material and semiconductor material are removed, a passivation material is provided onto the conductive material, block 235. In some embodiments the passivation material is not provided into the one or more vias. In other embodiments, the passivation material is applied into the vias and then removed. The gate oxide remaining in the vias is then etched away so that the vias are open to the substrate, block 240. A second conductive material is then provided that contacts the substrate in the vias, block 245. Additional layers that are required to form a semiconductor device are then provided, block 250.

Figure 6:
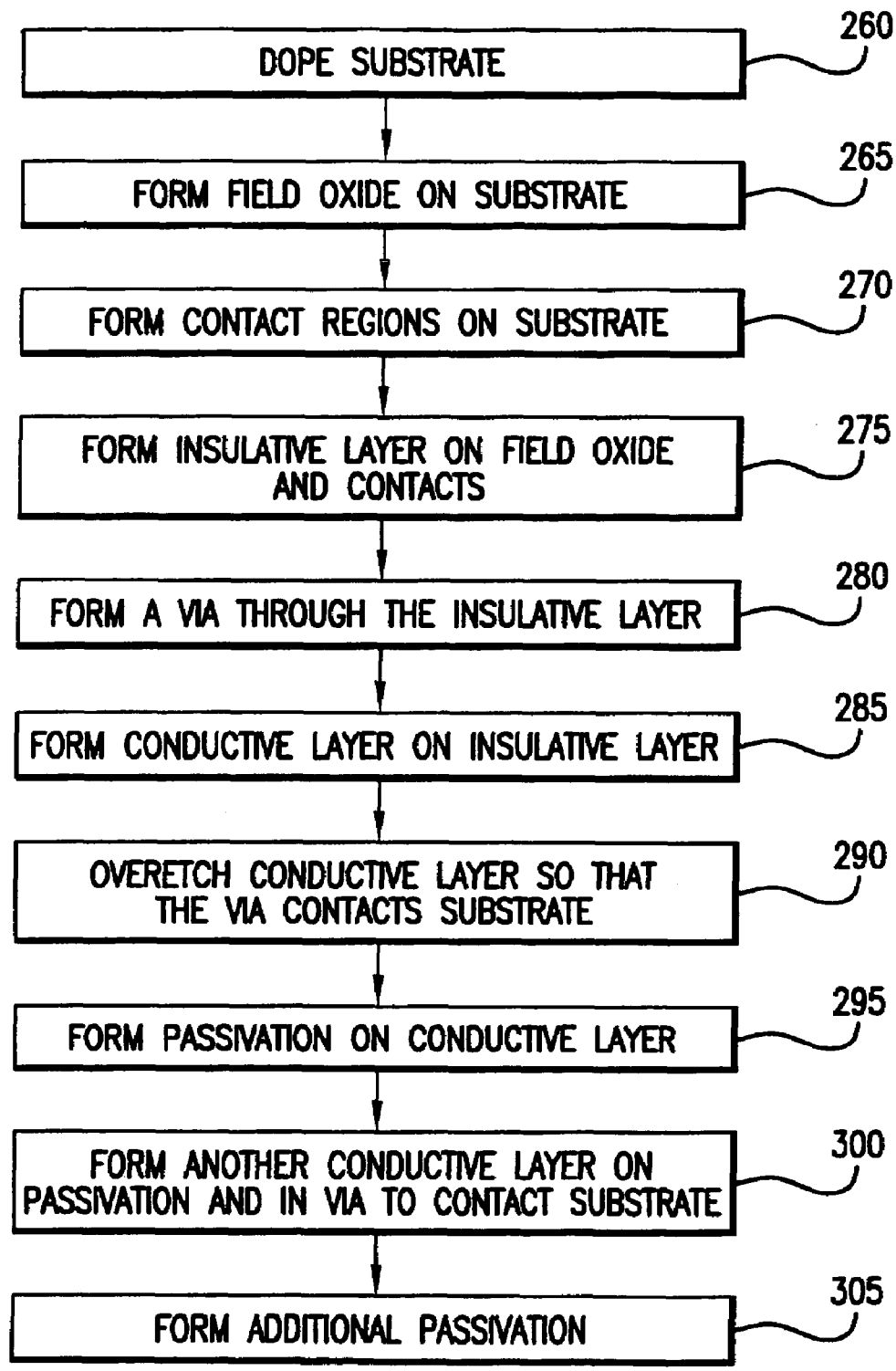
FIG. 6 illustrates a flow chart of a process for forming a fluid ejection device according to another embodiment.

Referring to FIG. 6 a flow chart of a process for forming a fluid ejection device according to another embodiment is illustrated. A substrate, e.g. substrate 10, may be doped with a p-dopant for an NMOS process, block 260. However, the substrate may also be doped with an n-dopant for a PMOS process, as described with respect to FIG. 5.

One or more contact regions are formed on the substrate, block 265. The one or more contact regions may be formed by, for example, disposing a semiconductor material upon a gate oxide which is disposed upon a surface of the substrate. A field oxide is then provided adjacent the contacts, block 270. Alternatively, field oxide may be provided, such that openings remain where contacts may be formed.

An insulative material, such as phosphosilicate glass, is provided over the contacts and field oxide, block 275. One or more vias are then formed through the insulative material, block 280. The vias are formed to overlie one or more of the contact areas. In such a way, the vias may correspond to regions where contact is to be made to the substrate or to areas where transistor gate contacts are to be formed.

After formation of the vias, a conductive material is provided overlying the insulative material and in the vias, block 285. The conductive material in the vias, and other regions as desired, is etched away, block 290. In one embodiment, the etching of the conductive material in the vias also etches, at least a portion of the contacts. The etching of at least a portion of the contacts may be accomplished, for example, by overetching utilizing a reactive ion etching process. In some embodiments, a secondary etching process may utilized after the first etching process, in order to remove any remaining contact material.

After the etching the conductive material, a second insulative material is provided onto the first conductive material, block 295. In one embodiment, the second insulative material is provided such that it does not fill or enter into the vias. In other embodiments, the second insulative material may be provided into the vias along with being provided onto the first conductive material. The second insulative material that is provided into the vias can then be removed utilizing know processes.

After the second insulative material is provided, a second conductive material is provided overlying second insulative material and into the vias, block 300. The second conductive material is provided into vias, such that portions of the second conductive material provided into the vias is in contact with the substrate, and an electrical contact to portions of the second conductive material overlying the second insulative material is provided. Additional passivation material may then be provided over the second conductive material and other portions of the device, block 305.

The embodiment depicted in FIG. 5, may be altered by omitting block 255 and only utilizing a field oxide. In this embodiment block 260 would entail providing field oxide over the entire area of a substrate where structures are to be formed. Further, block 280 may entail overetching the first conductive material so that the field oxide underlying the vias is etched away to allow contact to the substrate. Alternatively, a separate process block to remove the oxide prior to providing the first conductive material may be utilized and a standard etching process utilized at block 180.

Figure 7:
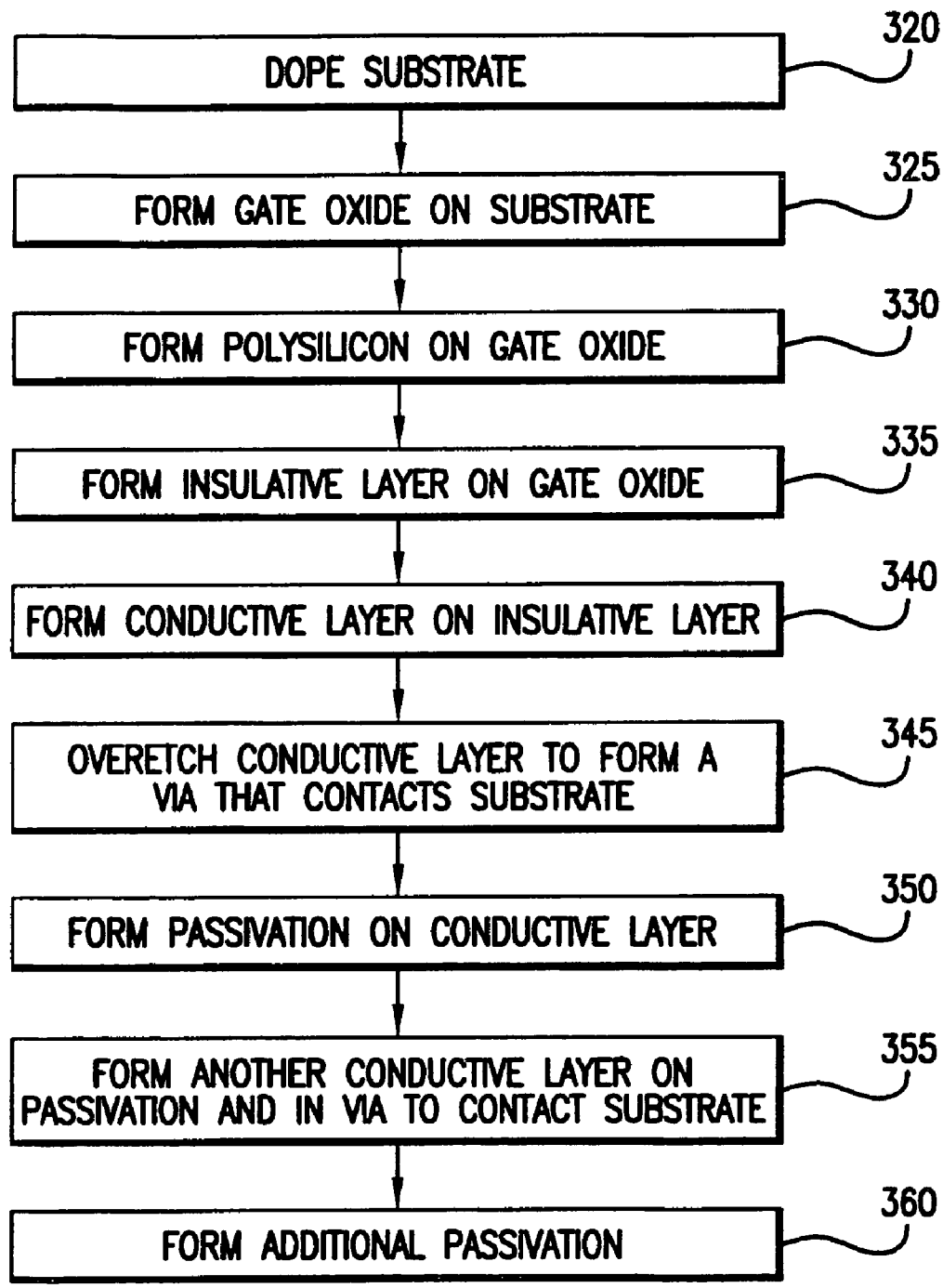
FIG. 7 illustrates a flow chart of a process for forming a fluid ejection device according to another embodiment.

Referring to FIG. 7, a flow chart of a process for forming a fluid ejection device according to another embodiment is illustrated. In the embodiment of FIG. 7, blocks 320-340 are substantially the same as blocks 200-215 and 225 of as described with respect to FIG. 5. However, instead of forming a via in the first insulative material prior to providing the first conductive layer, as in FIG. 5, vias are formed by etching through the first conductive layer and the first insulative layer in one process block, i.e. block 345. After formation of these vias, blocks 330-340 are substantially the same as blocks 235-245 as described with respect to FIG. 5.

As can be seen from FIGS. 4-6 the number of processing blocks need not be increased, in fact the number of blocks is substantially the same. Further, since an overetching process may be utilized, in some embodiments, the actual processes used to form a structure with a body contact are the same as those without. Further, since additional processing is not utilized to form the opening, i.e. other then etching the conductive layer, there is less likelihood that misalignment or diffusion into the substrate would occur then would result if additional processing was used to form the contact to the substrate.

In some embodiments of the methods described with respect to FIGS. 4 and 6, overetching can be such that portions of the substrate are removed along with the conductive, semiconductor, and gate oxide layers. This approach may be utilized, for example, where a contact is being made to a body of a substrate through a region of the device which has been doped as a source region of a transistor. The second conductive layer can then be provided such that it contacts the body region of the substrate, where the substrate has been etched away.

Figure 8:
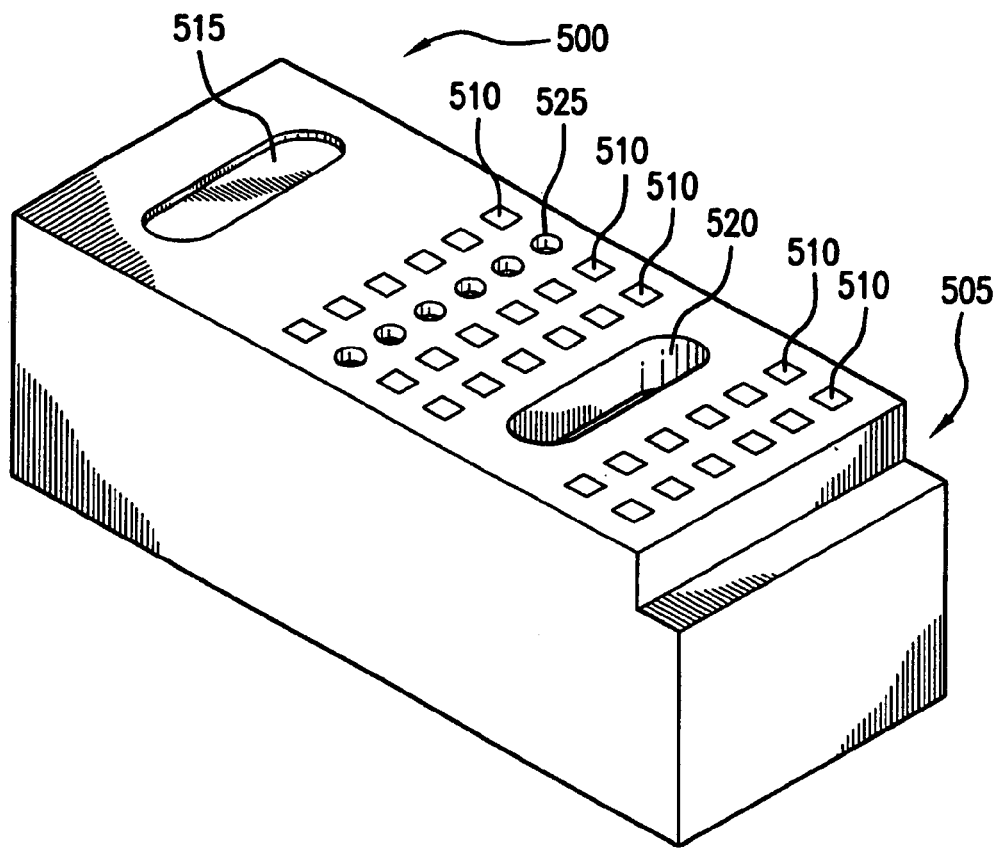
FIG. 8 illustrates a top-view of a fluid ejection device according to one embodiment.

FIG. 8 illustrates an enlarged view of one embodiment of the printhead 400 in perspective view. The printhead 500 in this embodiment has multiple features, including an edge step 505 for an edge fluid feed to resistors (or fluid ejectors) 510. The printhead may also have a trench 515 that is partially formed into the substrate surface. A slot (or channel) 520 to feed fluid to resistors 510, and/or a series of holes 525 feeding fluid to resistors 510 are also shown on this printhead. In one embodiment there may be at least two of the features described on the printhead 500 in FIG. 1. For example, only the feed holes 525 and the slot 520 are formed in the printhead 500, while the edge step 505 and/or the trench 515 are absent. In another embodiment, the edge step 505, and the slot 520 are formed in the printhead 520, while trench 515 and/or the feedholes 525 are absent. Different combinations of these features, with other features, or wholly different features may also be provided.

Figure 9:
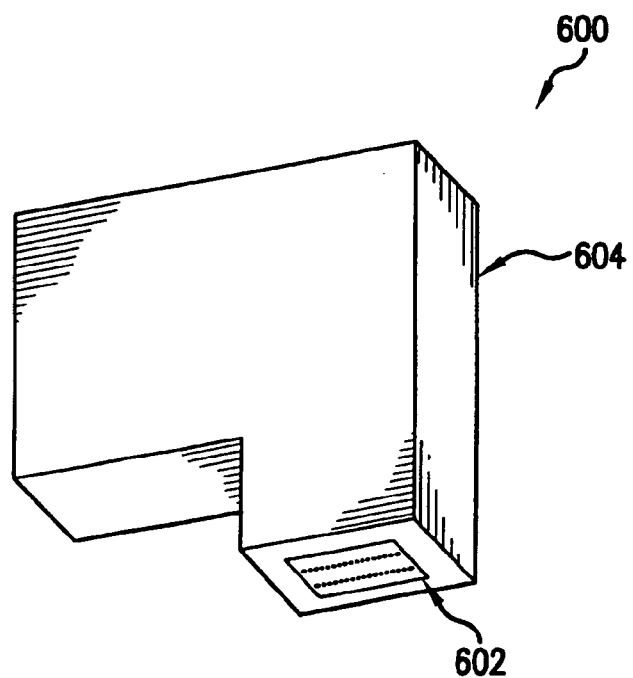
FIG. 9 illustrates a fluid ejection assembly according to one embodiment.

FIG. 9 shows a diagrammatic representation of an exemplary print cartridge 600 that can be utilized in an exemplary printing device. The print cartridge is comprised of a printhead 602 and a cartridge body 604 that supports the printhead. Though a single printhead 602 is employed on this print cartridge 600 other embodiments may employ multiple printheads on a single cartridge.

Print cartridge 600 is configured to have a self-contained fluid or ink supply within cartridge body 604. Other print cartridge configurations alternatively or additionally may be configured to receive fluid from an external supply. Other exemplary configurations will be recognized by those of skill in the art.

The semiconductor device structures described herein are applicable to a broad range of semiconductor devices technologies and can be fabricated from a variety of semiconductor materials. Therefore, while the above description describes several embodiments of semiconductor devices implemented in silicon substrates, the methods and structures described herein and depicted in the drawings may also be employed in gallium arsenide, germanium, and other semiconductor materials. Accordingly, the methods and structures described herein and depicted in the drawings is not intended to be limited to those devices fabricated in silicon semiconductor materials, but will include those devices fabricated in one or more of the available semiconductor materials and technologies available to those skilled in the art.

Further, while the illustrated embodiments have been shown to include specific p and n type regions, it should be clearly understood that the teachings herein are equally applicable to semiconductor devices in which the conductivities of the various regions have been reversed, for example, to provide the dual of the illustrated device.

In addition, although the embodiments illustrated herein are shown in two-dimensional views with various regions having depth and width, it should be clearly understood that these regions are illustrations of only a portion of a single cell of a device, which may include a plurality of such cells arranged in a three-dimensional structure. Accordingly, these regions will have three dimensions, including length, width, and depth, when fabricated on an actual device.

It should be noted that the drawings are not true to scale. Moreover, in the drawings, heavily doped regions (typically concentrations of impurities of at least $1 \times 10^{19}$ impurities/cm$^3$) are designated by a plus sign (e.g., n$^+$ or p$^+$) and lightly doped regions (typically concentrations of no more than about 5×10$^{16}$ impurities/cm$^3$) by a minus sign (e.g. p$^-$ or n$^-$).

Active area component, e.g. the source and drain, isolation of a MOSFET (metal oxide semiconductor field effect transistor) is conventionally accomplished by using two mask layers, an island layer and a gate layer. The island layer is used to form an opening within thick field oxide grouse on a substrate. The gate layer is used to create the gate of the transistor and forms the self-aligned and separate active areas (the source and drain) of the transistor within the island opening of the thick field oxide.

Although the inventive concepts have been described in language specific to structural features and methodological steps, it is to be understood that the appended claims are not limited to the specific features or steps described. Rather, the specific features and steps are disclosed as preferred forms of implementing the inventive concepts.

What is claimed is:

1. A method of forming a semiconductor device, comprising:
    forming a substrate including a first surface having at least one non-doped region;
    forming a first insulative material over the first surface of the substrate;
    forming at least one opening in the first insulative material, the opening forming a path to the substrate;
    forming a first conductive material over the first insulative material;
    etching the first conductive material so that the opening forming the path to the substrate is substantially free of the first conductive material and the first insulative material;
    forming a second insulative material over the first conductive material; and
    forming a second conductive material over the second insulative material, wherein the second conductive material is formed in the opening and is in contact with the non-doped region on the substrate.

2. The method of claim 1 further comprising forming a third insulative material and a polysilicon material on the substrate and below the first insulative material prior to forming the first insulative material and wherein forming the at least one opening comprises forming the opening through the polysilicon material to the third insulative material.

3. The method of claim 2 wherein etching the first conductive material comprises etching the third insulative material.

4. The method of claim 2 further comprising etching the first conductive material comprises etching the third insulative material after etching the first conductive material.

5. The method of claim 1 further comprising forming a third insulative material and a polysilicon material on the substrate and below the first insulative material, wherein forming the opening comprises forming the opening so that the path is between the third insulative material and the top surface of the first insulative material.

6. The method of claim 1 wherein forming the second conductive material comprises forming a resistive portion and a conductive portion disposed upon the resistive portion.

7. The method of claim 1 further comprising forming a field oxide on the substrate prior to forming the first insulative layer.

8. The method of claim 1 wherein etching the first conductive material comprises reactive ion etching the first conductive material.

9. The method of claim 1 wherein the substrate comprises a plurality of transistors formed therein and wherein forming at least one opening in the first insulative material comprises forming the at least one opening between two of the plurality of transistors.

10. The method of claim 1 wherein the substrate comprises a first region that has a first doping concentration and a second region underlying the first region, the second region having a second different doping concentration, wherein etching the first conductive material comprises etching the first region so that the path is formed to the second region.

11. The method of claim 1 wherein etching the conductive material comprises etching the first conductive material so that the path is formed to a region of the substrate below the first surface.

12. A method of forming a semiconductor device, comprising:
    forming a plurality of contact regions over a surface of substrate at least one contact region being a non-doped region;
    forming an insulative material over the plurality of contact regions;
    forming at least one opening through the insulative material and a portion of at least one contact of the plurality of contact regions;
    forming a first conductive material over the first insulative material, so that the at least one opening is substantially free of the first conductive material;
    forming a second insulative material over the first conductive material; and
    forming a second conductive material over the second insulative material, wherein the second conductive material is formed in the opening and forms an electrical contact with a non-doped region on substrate.

13. The method of claim 12 wherein forming the at least one opening comprises forming the at least one opening after forming the first conductive material so that the at least one opening is formed in the first insulative material and the first conductive material.

14. The method of claim 12 wherein forming the second conductive material comprises forming a resistive portion and a third conductive portion disposed upon the resistive portion.

15. The method of claim 12 wherein forming the contact regions comprises forming a third insulative material and a polysilicon material on the substrate.

16. The method of claim 15 wherein forming the insulative material and the polysilicon material comprises forming the insulative material and the polysilicon material on substantially all of the surface of the substrate.

17. The method of claim 12 wherein the substrate comprises a plurality of transistors formed therein and wherein forming the at least one opening in the first insulative material comprises forming the at least one opening between two of the plurality of transistors.

18. The method of claim 12 wherein forming the contact regions comprises forming a third insulative material and a polysilicon material in areas where the at least one opening is to be formed and forming field oxide in areas adjacent the third insulative material and the polysilicon material.

19. The method of claim 12 wherein the substrate comprises a first region that has a first doping concentration and a second region underlying the first region, the second region having a second different doping concentration, wherein forming at least one opening comprises removing material from the first region so that a path is formed to the second region from a top surface of the insulative material.

20. A method of forming a semiconductor device, comprising:
- forming a substrate including a first surface having at least one non-doped region;
- forming an insulative material over the first surface of the substrate;
- forming a first conductive material over the first insulative material;
- etching the first conductive material to form at least one opening that forms a path to the substrate that is substantially free of the first conductive material and the first insulative material;
- forming a second insulative material over the first conductive material; and
- forming a second conductive material over the second insulative material, wherein the second conductive material is formed in the opening and contacts the non-doped regions on the substrate.

21. The method of claim 20 further comprising forming a third insulative material and a polysilicon material on the substrate prior to forming the first insulative material and wherein etching the first conductive material comprises etching the polysilicon material.

22. The method of claim 20 wherein forming the second conductive material comprises forming a resistive portion and a third conductive portion disposed upon the resistive portion.

23. The method of claim 20 further comprising forming a field oxide on the substrate prior to forming the first insulative layer.

24. The method of claim 20 wherein etching the first conductive material comprises reactive ion etching the first conductive material.

25. The method of claim 20 wherein the substrate comprises a plurality of transistors formed therein and wherein forming at least one opening in the first insulative material comprises forming the at least one opening between two of the plurality of transistors.

26. The method of claim 20 further comprising forming one or more orifice layers over the second conductive material.

27. The method of claim 20 wherein the substrate comprises a first region that has a first doping concentration and a second region underlying the first region, the second region having a second different doping concentration, wherein etching the first conductive material comprises etching the first region so that the path is formed to the second region.

28. The method of claim 20 wherein etching the conductive material comprises etching the first conductive material so that the path is formed to a region of the substrate below the first surface.

* * * * *

UNITED STATES PATENT AND TRADEMARK OFFICE
CERTIFICATE OF CORRECTION

| | |
|---|---|
| PATENT NO. | : 7,543,917 B2 |
| APPLICATION NO. | : 11/540321 |
| DATED | : June 9, 2009 |
| INVENTOR(S) | : Simon Dodd et al. |

It is certified that error appears in the above-identified patent and that said Letters Patent is hereby corrected as shown below:

On the face page, in field (73), in "Assignee", in column 1, line 2, delete "comapny" and insert -- company --, therefor.

Signed and Sealed this

Twenty-ninth Day of September, 2009

David J. Kappos
*Director of the United States Patent and Trademark Office*